(12) United States Patent
Goldblatt et al.

(10) Patent No.: US 7,924,348 B2
(45) Date of Patent: Apr. 12, 2011

(54) METHOD AND APPARATUS FOR DISTRIBUTING MULTIPLE SIGNAL INPUTS TO MULTIPLE INTEGRATED CIRCUITS

(75) Inventors: Jeremy Goldblatt, Encinitas, CA (US); John Kitt, Newbury Park, CA (US); Peter Doherty, Encinitas, CA (US)

(73) Assignee: RF Magic, Inc., San Diego, CA (US)

( * ) Notice: Subject to any disclaimer, the term of this patent is extended or adjusted under 35 U.S.C. 154(b) by 1093 days.

(21) Appl. No.: 11/416,831

(22) Filed: May 3, 2006

(65) Prior Publication Data
US 2006/0277578 A1   Dec. 7, 2006

Related U.S. Application Data

(60) Provisional application No. 60/677,745, filed on May 4, 2005.

(51) Int. Cl.
*H04N 5/50* (2006.01)
*H04N 5/44* (2011.01)

(52) U.S. Cl. ...................................... 348/731; 348/725
(58) Field of Classification Search .................. 348/725, 348/731
See application file for complete search history.

(56) References Cited

U.S. PATENT DOCUMENTS

| | | | | |
|---|---|---|---|---|
| 4,509,008 A | * | 4/1985 | DasGupta et al. | 714/731 |
| 4,996,691 A | * | 2/1991 | Wilcox et al. | 714/820 |
| 7,555,048 B1 | * | 6/2009 | Massoumi et al. | 375/260 |
| 2002/0114415 A1 | * | 8/2002 | Lee et al. | 375/354 |
| 2002/0149707 A1 | * | 10/2002 | Van Der Wijst et al. | 348/820 |
| 2003/0034843 A1 | * | 2/2003 | Fanous et al. | 330/254 |
| 2003/0035070 A1 | * | 2/2003 | Fanous et al. | 348/707 |
| 2003/0137607 A1 | * | 7/2003 | Kovacic et al. | 348/731 |
| 2003/0206063 A1 | * | 11/2003 | Fanous et al. | 330/254 |
| 2003/0227574 A1 | | 12/2003 | Englmeier | |
| 2004/0021508 A1 | * | 2/2004 | Fanous et al. | 327/560 |
| 2004/0027162 A1 | * | 2/2004 | Cecchi et al. | 326/82 |
| 2004/0124919 A1 | * | 7/2004 | Fanous et al. | 330/124 R |
| 2004/0233099 A1 | * | 11/2004 | Jenabi | 342/188 |
| 2005/0007197 A1 | * | 1/2005 | Fanous et al. | 330/254 |
| 2005/0116774 A1 | * | 6/2005 | Fanous et al. | 330/124 R |
| 2005/0259186 A1 | * | 11/2005 | Mehr et al. | 348/731 |
| 2008/0284546 A1 | * | 11/2008 | Choi | 334/1 |
| 2009/0190639 A1 | * | 7/2009 | Ruha et al. | 375/222 |

* cited by examiner

*Primary Examiner* — Brian Yenke
(74) *Attorney, Agent, or Firm* — Michael W. Landry; Bruce W. Greenhaus

(57) ABSTRACT

An integrated circuit (IC) structure and method of distributing multiple broadband signal inputs to multiple integrated circuits, where each IC receives at least one original signal and outputs a replica of the original signals to other ICs and receives at least one replica signal output by another IC.

6 Claims, 16 Drawing Sheets

METHOD AND APPARATUS FOR DISTRIBUTING MULTIPLE SIGNAL INPUTS TO MULTIPLE INTEGRATED CIRCUITS

RELATED APPLICATIONS

This application claims the benefit of U.S. Provisional Application No. 60/677,745 filed May 4, 2005 entitled "Method and apparatus for distributing multiple signal inputs to multiple integrated circuits" and incorporated herein by reference.

BACKGROUND

1. Field of the Invention

The present invention relates to multiple-tuner receiver systems and specifically to distribution of multiple received signals to multiple tuners.

2. Prior Art

FIG. 1 shows an application requiring the distribution and processing of multiple signals in a direct broadcast satellite (DBS) receiver system where there are multiple low noise block converters (LNBs) that receive signals from multiple satellite transmitters. Additionally, each satellite signal may have a horizontal and vertical polarized signal that results in two output signals from each LNB. For a three LNB receiver antenna, there could be six independent bands of signals that require distribution to satellite integrated receiver decoders (IRDs). Any IRD may attempt to tune any one of the bands, requiring an N-way crosspoint connection from any LNB output to any IRD. Conventional satellite outdoor units (ODUs) use a multiport switch to route an LNB signal to an IRD that is controlled by signals from the IRDs transmitted up the coaxial cable connection to the ODU.

Multiple-tuner receivers are used in IRDs, cable set-top boxes (STBs), and picture-in-picture (PIP) television receivers when more than one television signal requires simultaneous processing. Digital video recorders (DVRs) also use multiple tuners to record one or more channels while another channel is being displayed.

The tuners each receive a radio frequency (RF) signal comprising several frequency division multiplexed (FDM) channels. The tuners select one channel for processing. The tuner may comprise the functions of bandpass filtering and frequency translation.

As shown in FIG. 2, conventional multiple tuner receiver systems receive one or more broadband signals comprising many independent channels and power split each broadband signal, with or without amplification, to drive multiple tuners. A power splitter is typically a passive device and can function as a summer or a splitter. The power splitting and amplification results in a degradation of the signal to noise ratio (SNR) of the signal.

When using a two-layer circuit board, splitting and distributing signals to multiple devices is difficult due to the need for signal crossovers, disruption of the ground plane, and switching between layers. These routing issues in the circuit board wiring disturb the controlled impedance of the wiring and alter the power level balance across the broadband signal and among the various signals. A further problem is implementing splitters on a circuit board for signal frequencies below standard satellite intermediate frequencies, which is challenging due to the long wavelengths and large circuit element sizes.

SUMMARY OF THE INVENTION

An integrated circuit (IC) structure and method of distributing multiple signal inputs to multiple integrated circuits, where each IC receives at least one original signal and outputs a replica of the original signals to other ICs and receives at least one replica signal output by another IC. In one embodiment, the IC can contain one or more television signal tuners on one die and is called an IC tuner. The ICs can convert the single ended format of the received signal to differential for interference rejection. The invention enables an efficient solution for distribution of signals to multiple ICs by eliminating the need for extra components to split and amplify the signals. The invention also minimizes degradation of the signal as it is distributed to multiple devices because no power splitting of the signal occurs. A signal from one source is routed to one destination allowing for simplified circuit board routing and thus impedance levels are maintained and power balance is preserved.

The method of distributing multiple signals to multiple integrated circuits can be use in a satellite outdoor unit where several LNB outputs are tuned and combined. The method can also be used in a television, STB, IRD, or DVR that receives and tunes multiple signals.

DETAILED DESCRIPTION OF THE INVENTION

Figure 1:
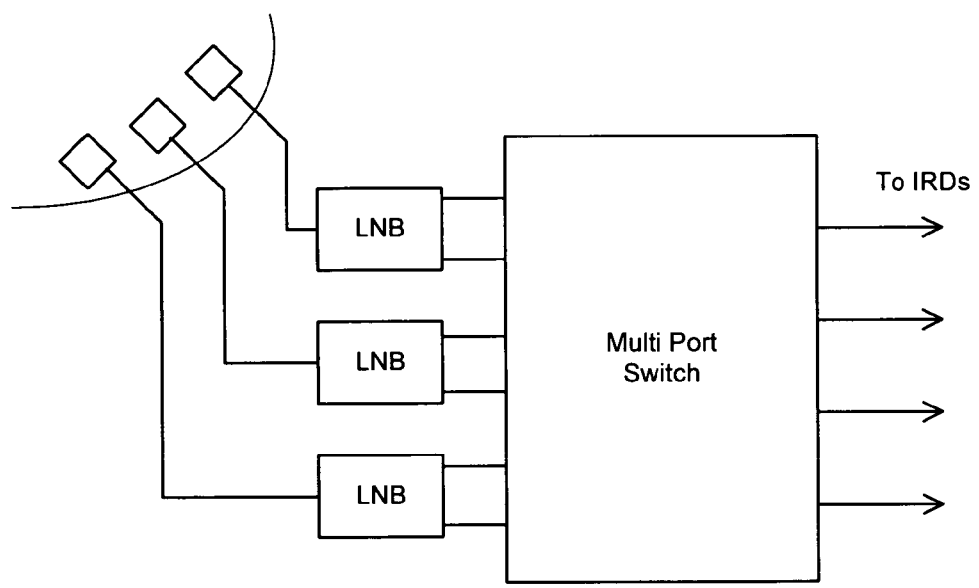
FIG. 1 shows a prior art approach to distributing multiple signals in a satellite receiver system using a multiport switch.
Figure 2:
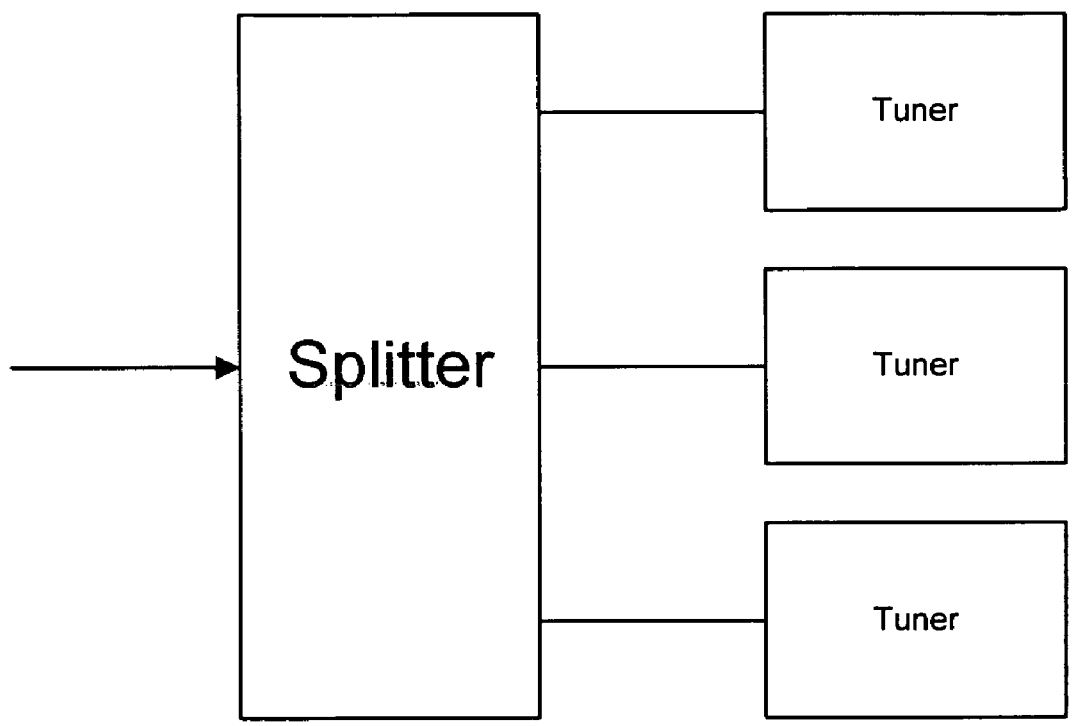
FIG. 2 shows a prior art approach to distributing a signal to multiple tuners using a power splitter.
Figure 3:
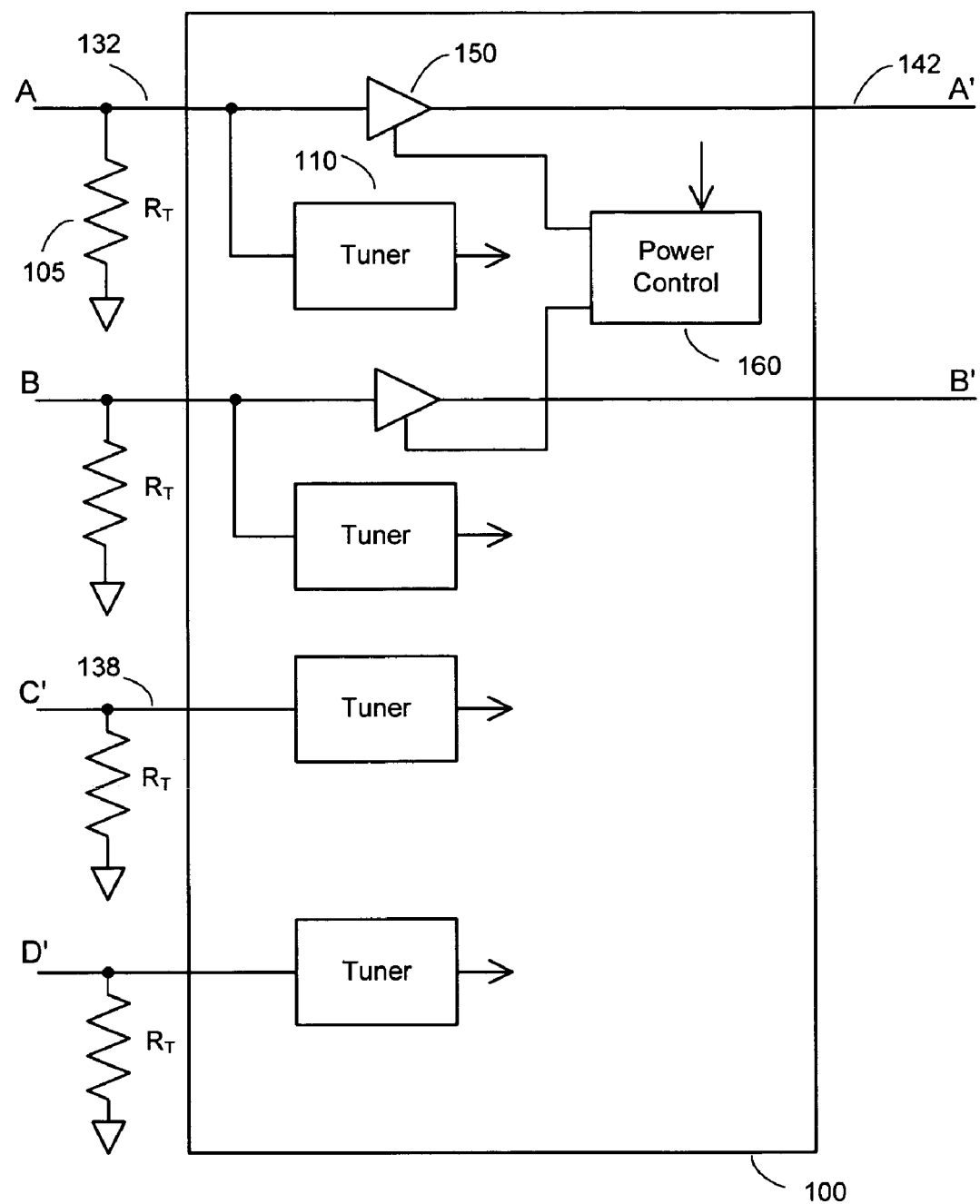
FIG. 3 shows a block diagram of an integrated circuit tuner according to the present invention, with one tuner for each received signal.

FIG. 3 shows signal processing inside an integrated circuit tuner 100 according to the present invention. Optional termination resistor 105 matches the transmission line characteristic impedance of input signal 132 and can be external to the IC, as shown, or internal, or omitted in some applications. One tuner 110 is provided for each input signal. A selected number of the input signals 132 are replicated by a buffer amplifier 150 and drive output 142. The amplifier 150 has a power enable input that allows the power to be tuned off by a power control circuit 160, thereby disabling the output signal. Power control 160 can accept a power control signal from an internal programmable register or an input pin to the IC. Other input signals, for example C' 138 are received from another IC and are not replicated. In the embodiment shown, one tuner is provided for each input signal.

Figure 4:
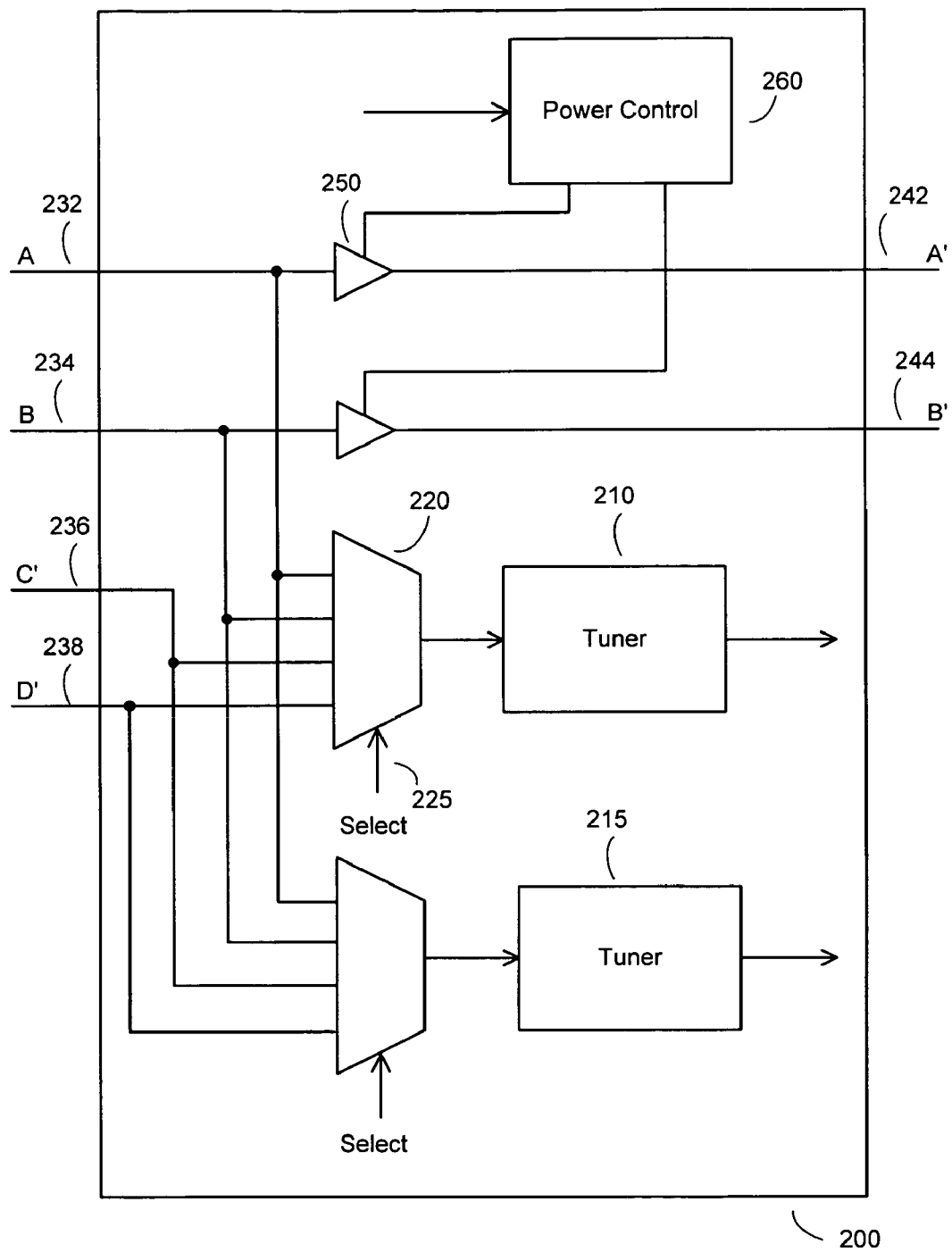
FIG. 4 shows a block diagram of an integrated circuit tuner according to the present invention, with one tuner for several received signals and a signal selector.

FIG. 4 shows another embodiment of the integrated circuit tuner 200 using data selectors 220, also called multiplexers, to route one of the input signals to a tuner within the IC. One or more tuners are provided in the IC to receive and process input signals, for example tuners 210 and 215. Data selector 220 couples one selected input signal to tuner 210 under control of a select signal 225, which can come from an internal register programmed from an external command, such as through an inter-integrated circuit ($I^2C$, I-squared-C) bus. Inputs A 232 and B 234 are replicated to produce outputs A' 242 and B' 244. The inputs are replicated with a buffer amplifier 250, which can have a gain of approximately unity, or any other gain ranging from less than to greater than unity. Buffer amplifier 250 has a power enable input that allows the amplifier to be disabled, using well-known amplifier techniques. Amplifier 250 is preferably a low noise amplifier of the type generally known in the art. Power control circuit 260 can be controlled by an internal register or an input pin to the IC. Inputs C' 236 and D' 238 are received from another IC tuner and do not require replication.

In each embodiment, the tuners receive a broadband signal and provide one or more tuning functions such as channel selection, bandpass filtering, and frequency translation. The interconnection of the present invention can be used with any type of tuners. The outputs of the tuners can be further processed in close proximity to the tuners. In one embodiment, the tuners located in an ODU couple one or more selected channels to the signal cables connected to IRDs. The tuner outputs can be combined in a band-stacking manner to send multiple channels down each cable to the IRDs. Band-stacking is described in U.S. Pat. No. 5,959,592 incorporated herein by reference, by Petruzzelli, which addresses combining both the left hand circular polarized (LHCP) and right hand circular polarized (RHCP) signals into one signal cable that is transmitted from the ODU to an IRD.

Figure 5:
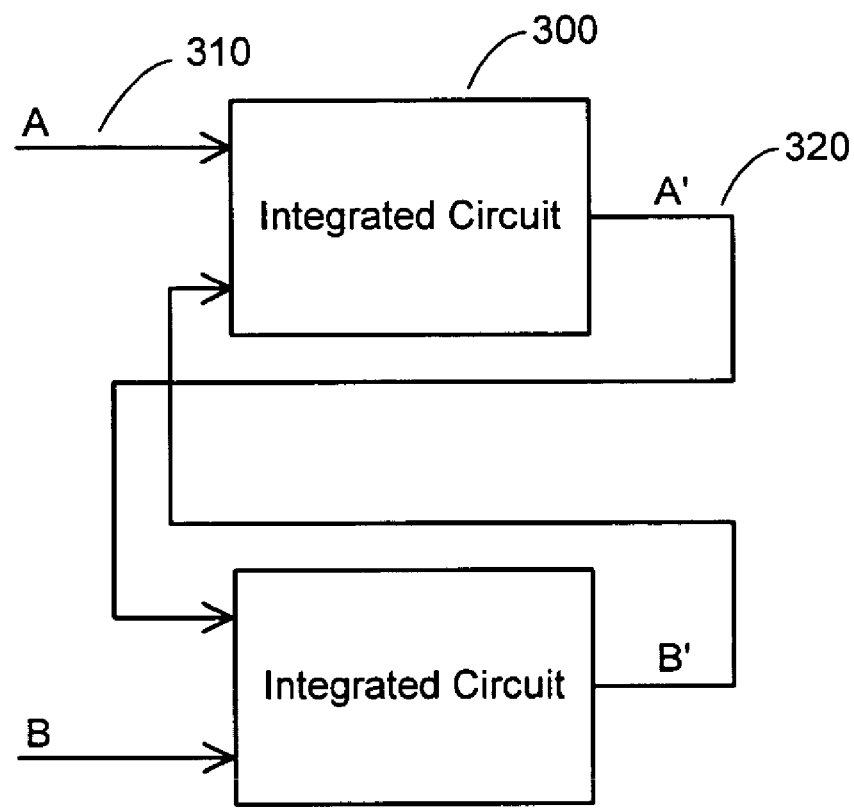
FIG. 5 shows the interconnect of two integrated circuit tuners according to the present invention.

FIG. 5 illustrates a scenario where two broadband satellite inputs A and B are to be processed. The signal A' is a single-ended or differential buffered replica of A, and B' is a single-ended or differential buffered replica of B. The two ICs are connected together. Each IC 300 accepts one original input signal 310, and outputs one replicated signal 320. The ICs can have a single internal tuner with a multiplexer at the tuner input or two internal tuners to simultaneously process the two input signals.

FIG. 6 through FIG. 10 show alternative interconnection embodiments with various configurations of signals and integrated circuits. The output signal connecting between devices in these figures are shown on the left of the devices for convenience. These configurations shows that each signal has one source and one destination thus enabling controlled impedances, simplified circuit board wiring, and avoiding degradation of the signal.

Figure 6:
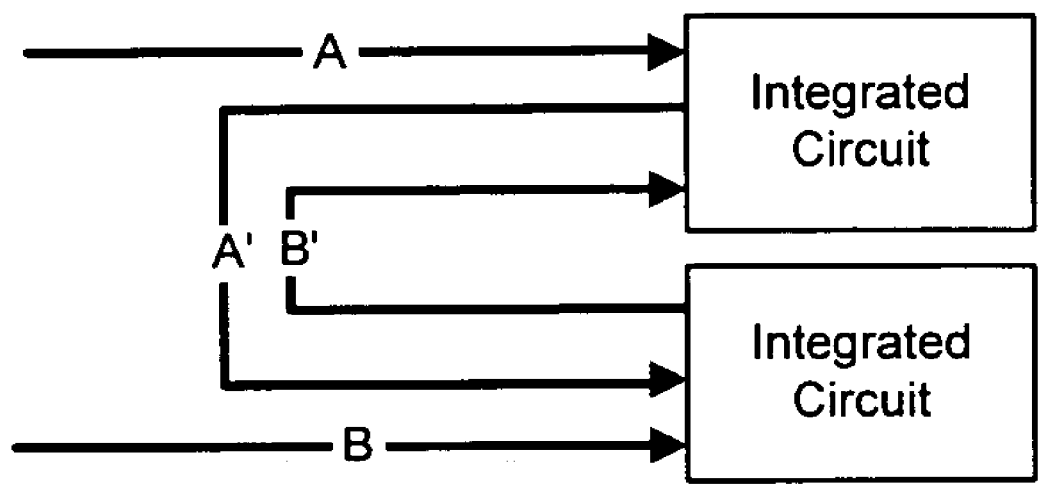
FIG. 6-10 show alternative interconnection embodiments with various configurations of signals and tuner integrated circuits.

FIG. 6 shows a configuration that uses two ICs with two input signals.

Figure 7:
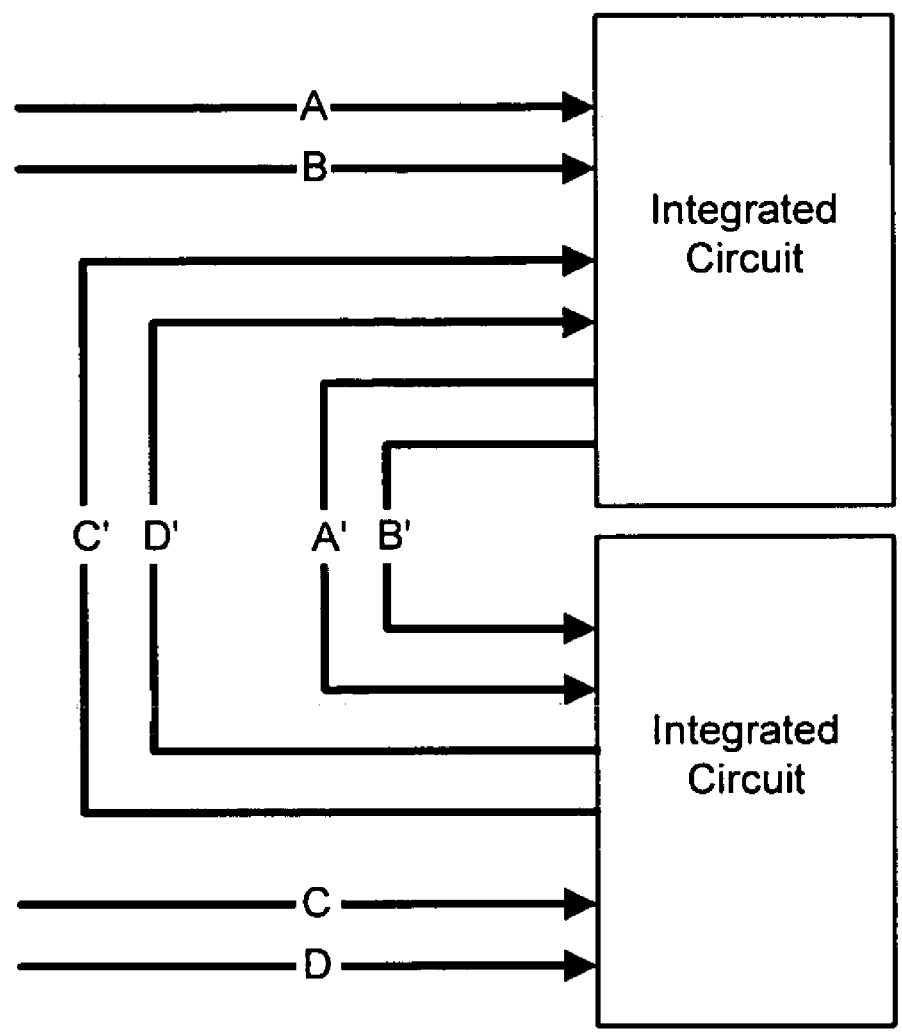

FIG. 7 shows this methodology applied to four signals using two ICs, each having four inputs of which two are the raw inputs and the remaining two inputs are replicas of the other two raw inputs. Each IC has two outputs where the replica signals exit to drive other similar ICs.

Figure 8:
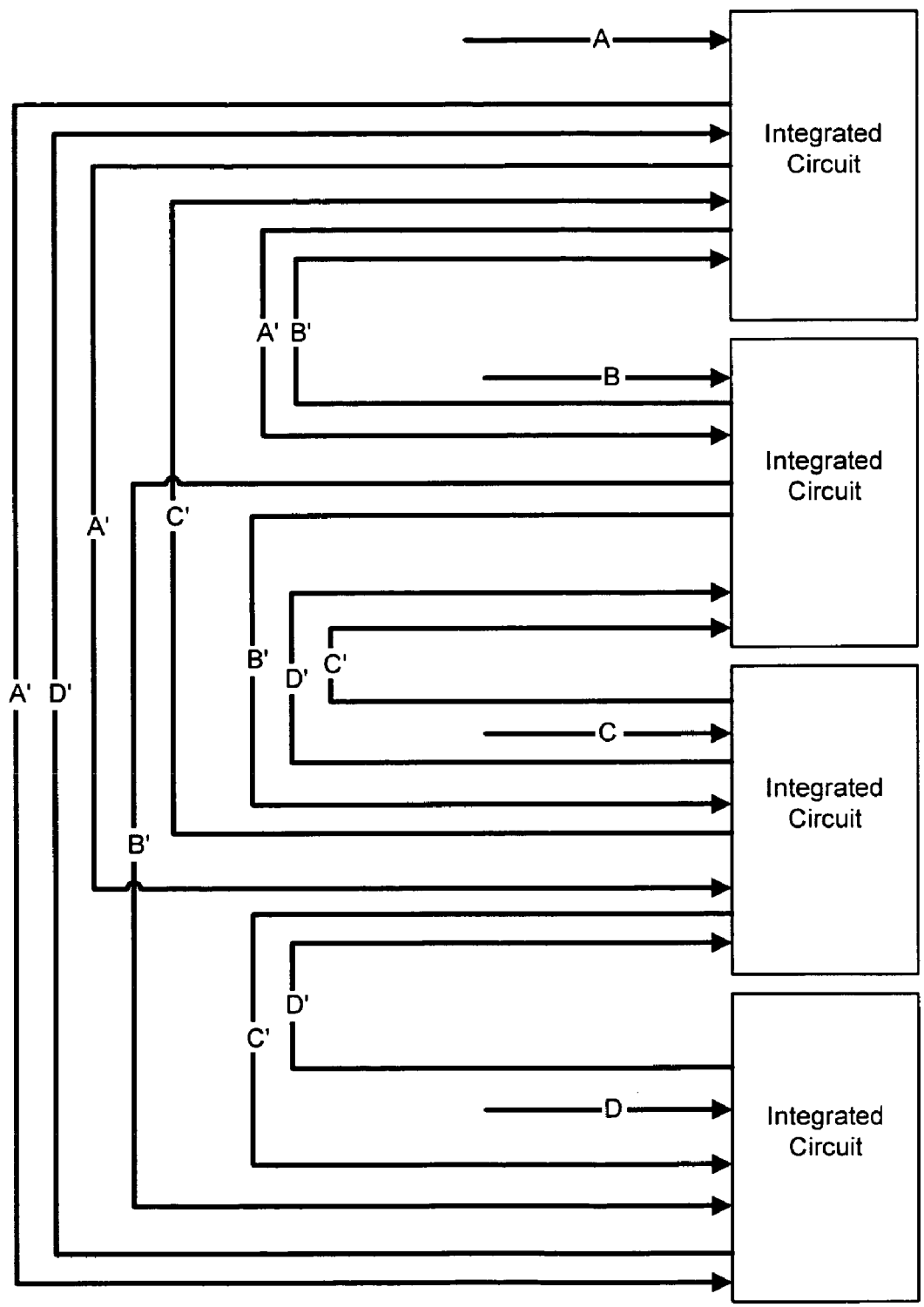

FIG. 8 illustrates a configuration for 4 inputs using 4 ICs.

Figure 9:
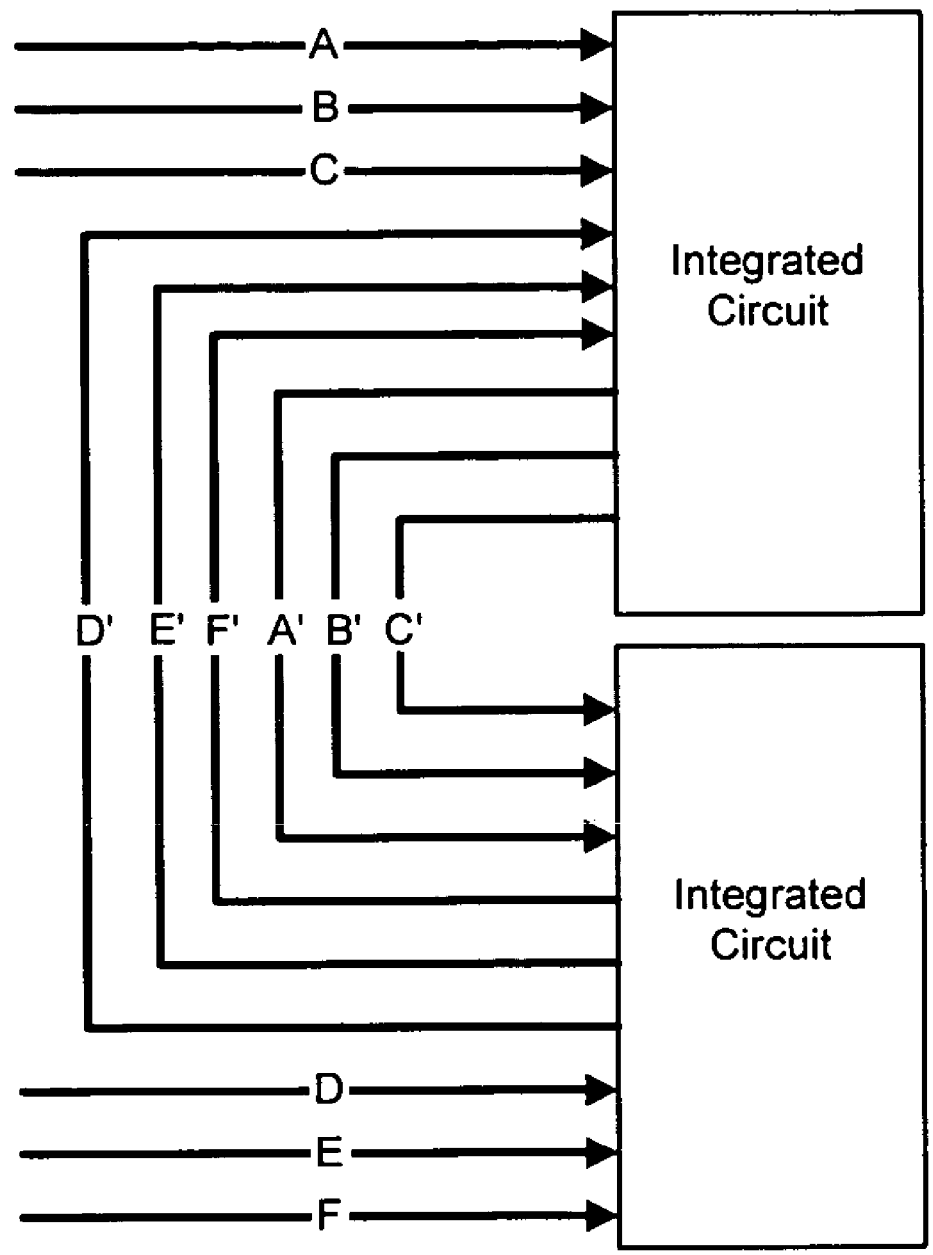

FIG. 9 shows a six input, two IC configuration.

Figure 10:
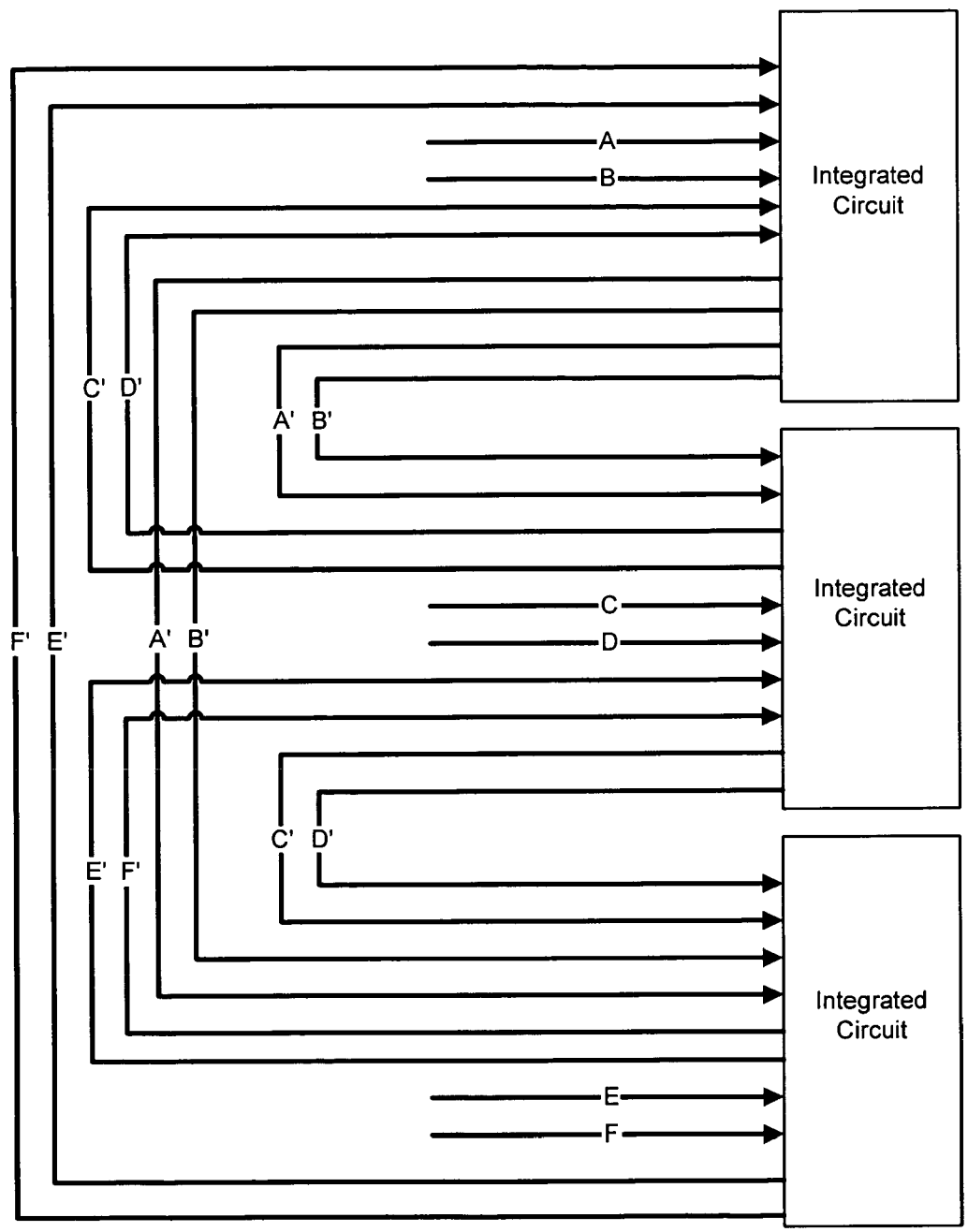

FIG. 10 shows an example using three ICs with 6 inputs.

An integrated circuit (IC) can be fabricated with a predetermined number of original inputs and predetermined number of outputs that corresponds to a particular configuration of signal inputs and ICs.

Alternatively, each IC can have one or more tuners and a multiplexer/signal selector on the input that selects which of the N inputs is processed by the tuner in the IC.

A programmable/flexible IC for use in a multi-signal/multi-tuner system can be configured as follows:

Assuming that all ICs accept the same number of input signals, for each signal input to an IC (total of N signals), provide at most N−1 outputs, which is needed when the number of input signals equal the number of ICs. This allows for expansion to any number of ICs in a practical application, where at most one IC is needed for each input signal. In some configurations, not all of the outputs will be connected to another IC. Therefore, less than N−1 outputs can be provided, which precludes certain configurations.

For each replica output driver, a multiplexer/signal selector selects an input signal to replicate for distribution to other ICs. Since at least one original input signal will be connected to each IC, one of the replica outputs does not need a multiplexer and that replica output is derived internally from the designated fixed original input.

With N signals distributed to K number of ICs, each IC has N/K original inputs and K−1 replica outputs for each of the original inputs, a total of (K−1)N/K=N−N/K replica outputs. Therefore, each IC has N−N/K replica inputs. Each IC accepts N/K original input signals, duplicates each original input signal to K−1 output replicas of each original input. The K−1 replica outputs are routed to the other K−1 ICs.

Examples of possible combinations:
4 signals, 2 ICs (as shown in FIG. 5):
N=4; K=2
For each IC:
N/K=4/2=2 original inputs
(K−1)=2−1=1 replica outputs for each original input
(K−1)(N/K)=(1)(2)=2 total replica outputs
N−N/K=4−4/2=2 replica inputs
4 signals, 4 ICs (as shown in FIG. 8):
N=4; K=4
For each IC:
N/K=1 original input
K−1=3 replica outputs for each original input
(K−1)(N/K)=3 total replica outputs
N−N/K=3 replica inputs
6 signals, 2 ICs (as shown in FIG. 9):
N=6; K=2
For each IC:
N/K=3 original inputs
K−1=1 replica outputs for each original input
(K−1)(N/K)=3 total replica outputs
N−N/K=3 replica inputs
6 signals, 3 ICs (as shown in FIG. 10):
N=6; K=3
For each IC:
N/K=2 original inputs
K−1=2 replica outputs for each original input
N−N/K=4 total replica outputs=4 replica inputs A generalized redistribution can be applied to any number of input signals and IC's.

Figure 11:
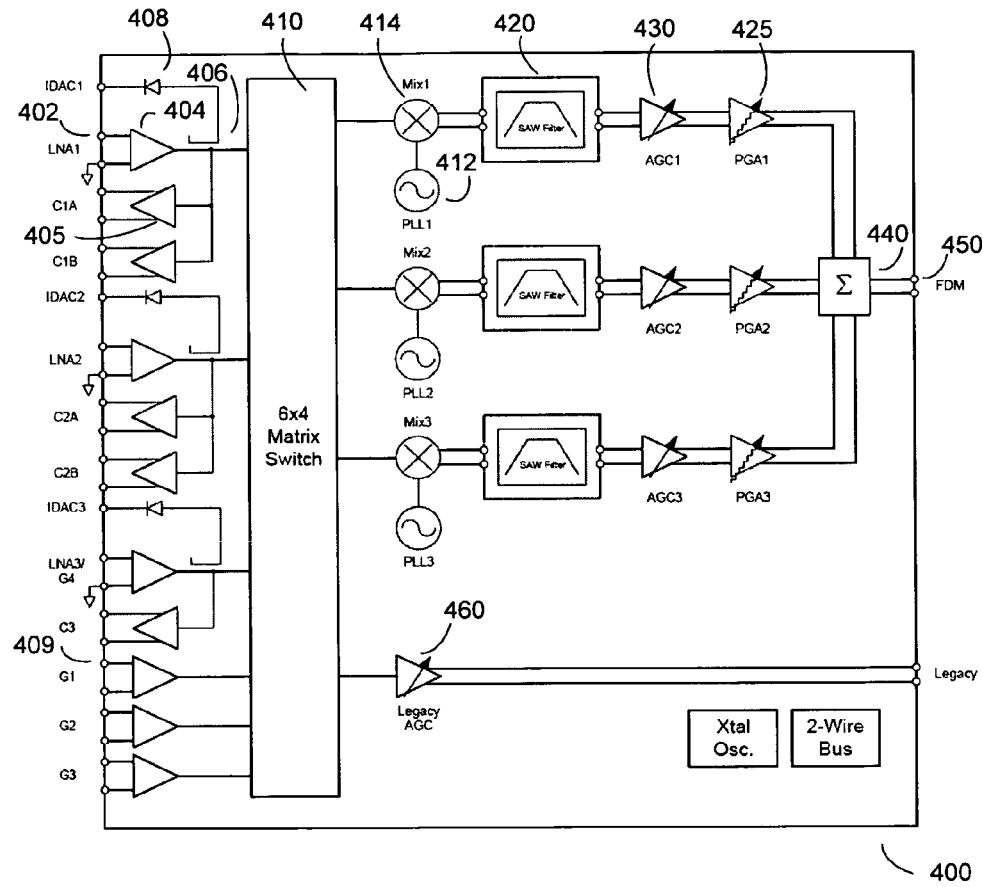
FIG. 11 shows a simplified block diagram of an integrated circuit according to the present invention.

FIG. 11 shows a simplified block diagram of an integrated circuit 400 according to the present invention. For each original signal input 402, one or more amplifiers 404 and 405 produce replicas of the input signal. A coupler 406 and detector 408 provide a power monitor signal for each input. Inputs 409 receive replica signals from other similar integrated circuits. A matrix switch 410 enables routing any input to one of the frequency translators. A separate phase locked loop (PLL) synthesizer provides a local oscillator (LO) signal 412 for each of the translators 414. A bandpass filter 420 selects one channel or band of channels. Programmable gain amplifiers (PGAs) 425 and automatic gain control (AGC) circuits 430 operate in conjunction with the detected power signal provide for an adjusted signal level into the combiner 440. In addition to the frequency division multiplex output 450, a legacy output 460 drives a standard IRD with one selected signal input.

Figure 12:
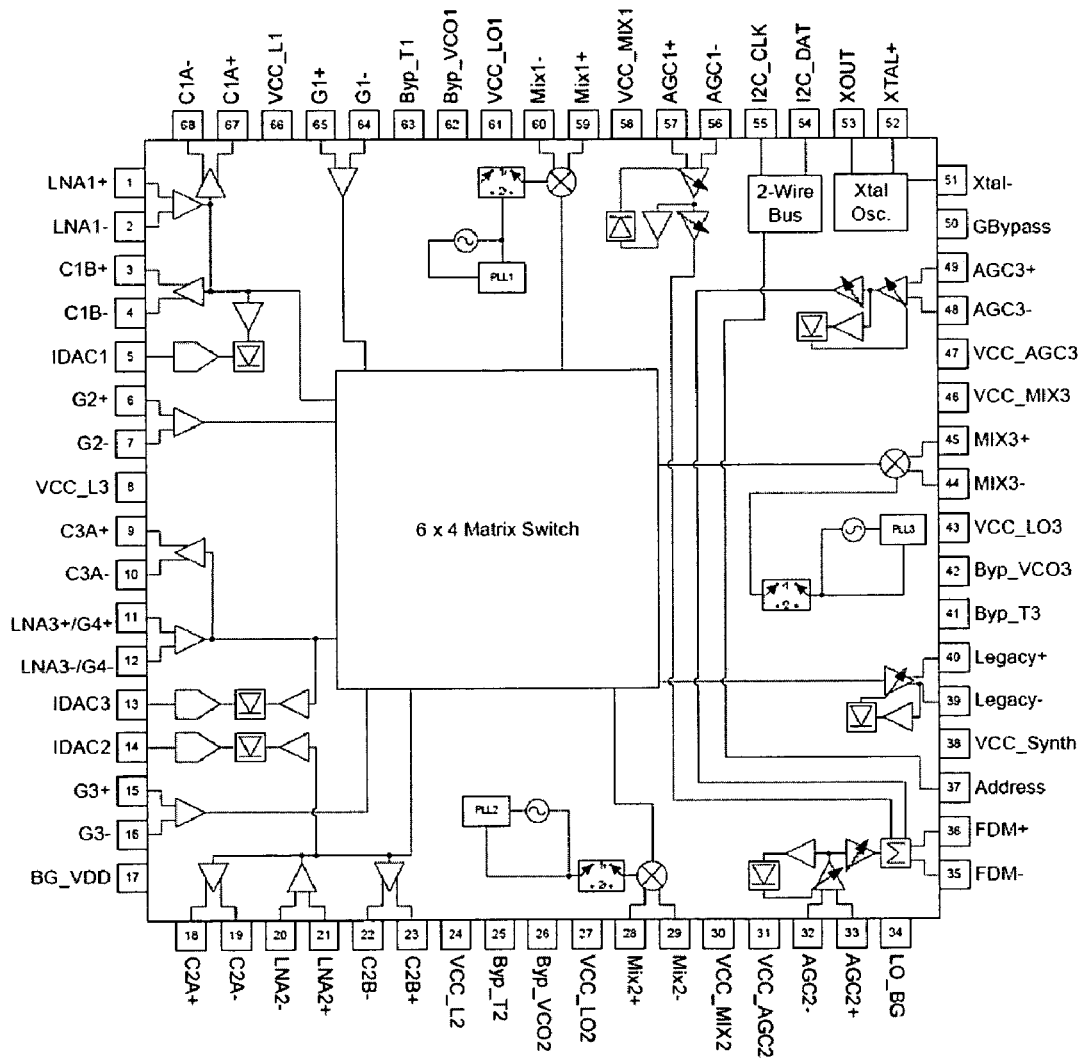
FIG. 12 shows a functional diagram and package pin-out of an integrated circuit according to the present invention.

FIG. 12 shows a functional diagram and package pin out of an integrated circuit according to the present invention.

Figure 13:
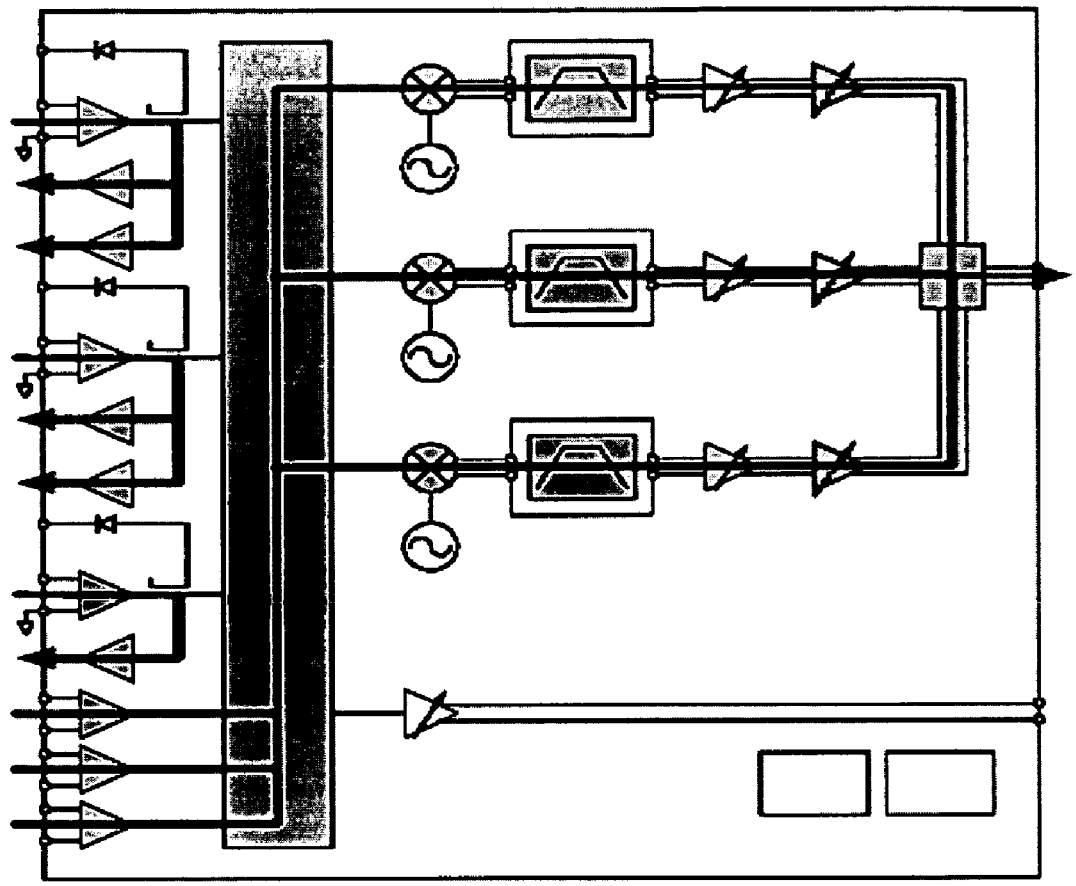
FIG. 13 shows signal flow using LNA input and cascaded signals received from another IC.

FIG. 13 shows signal flow of the circuit of FIG. 11 using LNA input and cascaded signals received from another IC.

Figure 14:
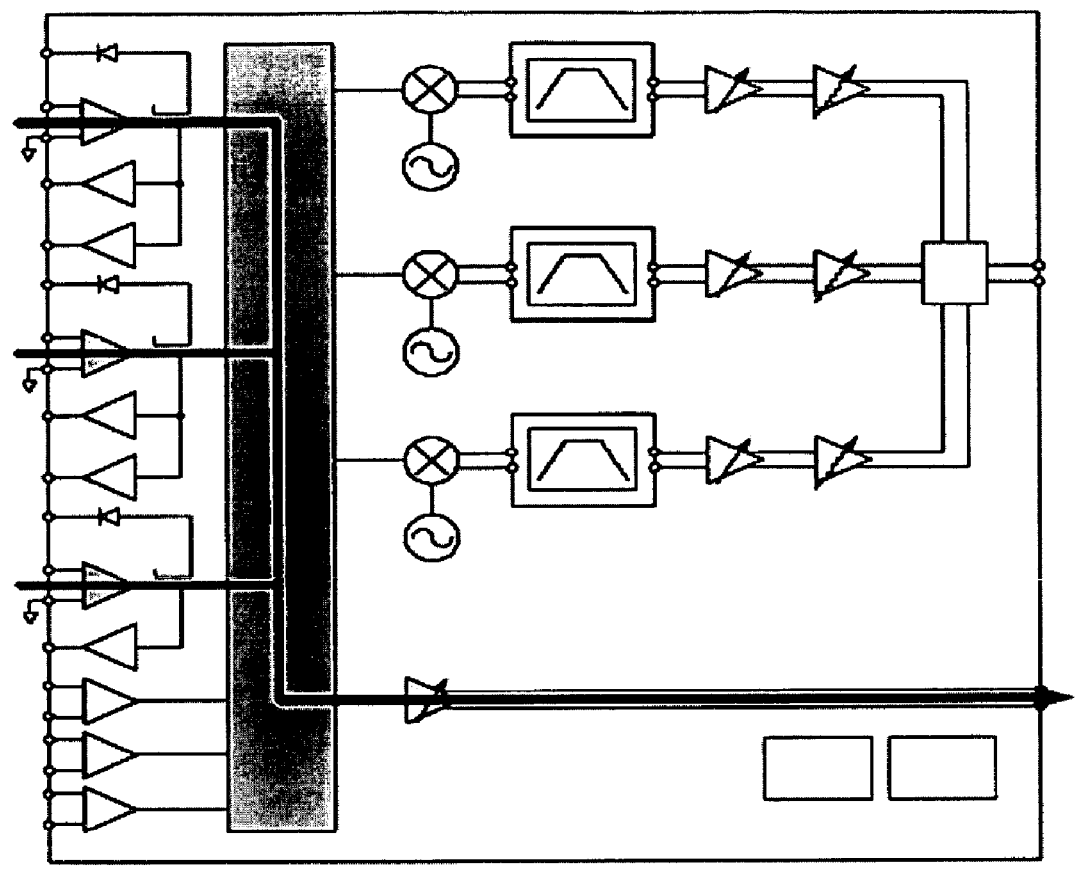
FIG. 14 shows signal flow with legacy output.

FIG. 14 shows signal flow with broadband non-frequency translated output.

Figure 15:
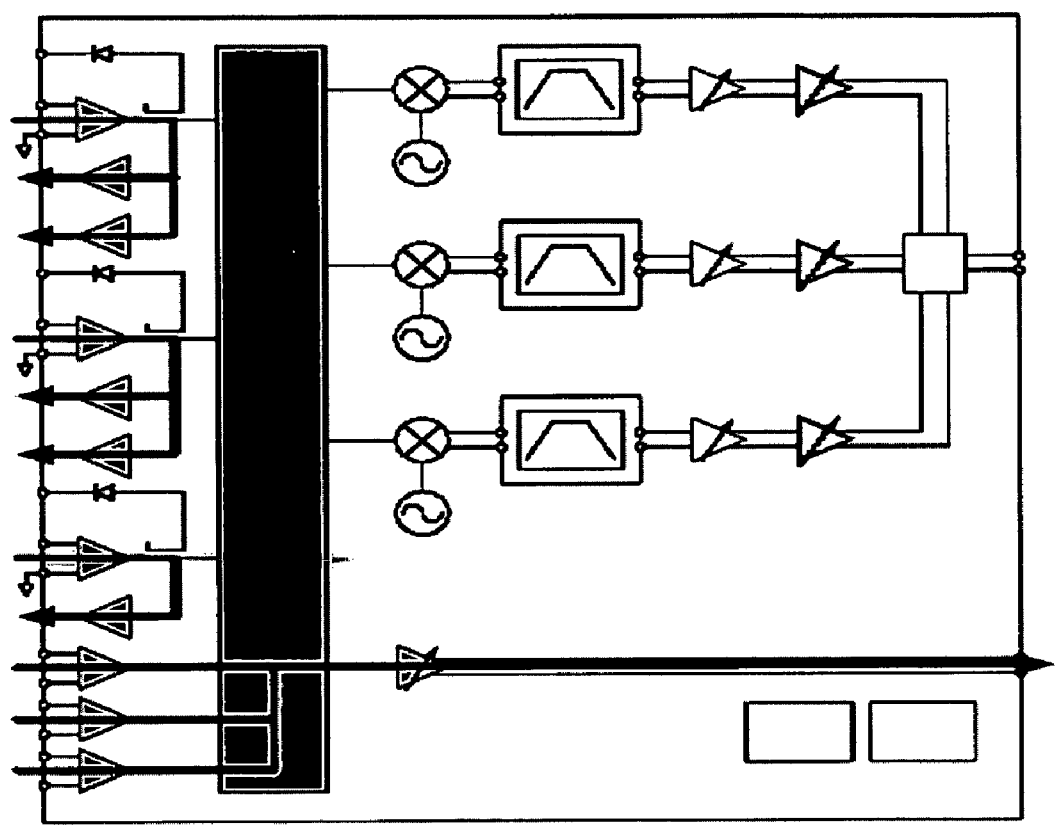
FIG. 15 shows signal flow with cascaded signals and legacy output.

FIG. 15 shows signal flow with cascaded signals and broadband non-frequency translated output.

Figure 16:
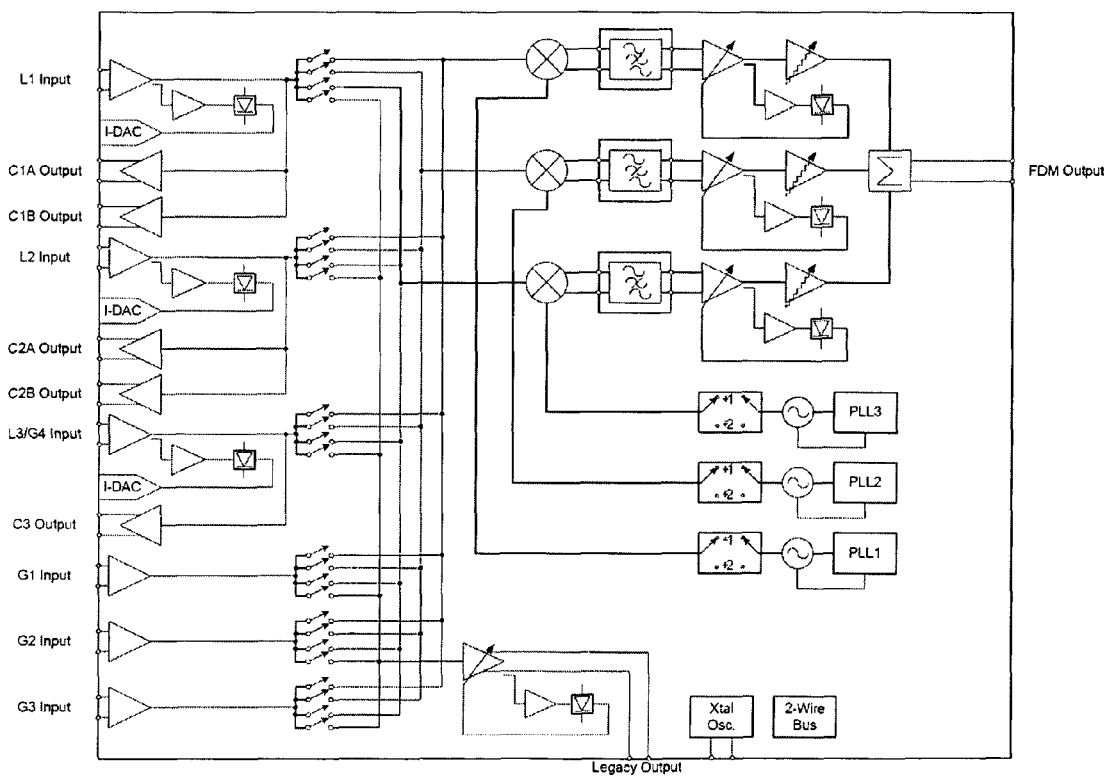
FIG. 16 shows a detailed block diagram of an integrated circuit according to the present invention.

FIG. 16 shows a detailed block diagram of an integrated circuit according to the present invention showing further details of the functions of the device shown in FIG. 11.

Integrated circuit tuners interconnected and employing the distribution method and apparatus of the present invention can be incorporated into satellite receiving systems outdoor units or integrated receiver decoders, set-top boxes, digital video recorders, or television receivers.

What is claimed is:

1. A signal tuner integrated circuit (IC) for processing a plurality of signals and driving at least one other signal tuner integrated circuit comprising:
    a first input for receiving an original signal;
    a buffer amplifier for creating a first replica output signal from the original signal and driving the first replica output signal through a first replica output;
    a second input for receiving a second replica output signal from another signal tuner integrated circuit;
    a switching mechanism having a first switch input, a second switch input, and a switch output, the first input coupled to the first switch input and the second input coupled to the second switch input; and
    a tuner coupled to the switch output, thereby selectively coupling the tuner to the first input for processing the original signal and
    to the second input for processing the second replica output signal.

2. The tuner IC of claim 1 further comprising a power control on the buffer amplifier to disable the replica output signal.

3. The tuner IC of claim 1 further comprising a combiner and plurality of tuners each connected to the combiner through programmable gain amplifiers whereby the signal levels output from the tuners into the combiner can be adjusted.

4. The tuner IC of claim 1 wherein the buffer amplifier has programmable gain.

5. The signal tuner integrated circuit of claim 1 wherein the switching mechanism is a multiplexer.

6. A signal receiving system for receiving a plurality of original signals comprising a plurality of signal tuner integrated circuits of claim 1 wherein each signal tuner integrated circuit receives at least one original signal and at least one replica signal from another signal tuner integrated circuit and each signal has a single destination integrated circuit.

\* \* \* \* \*